United States Patent [19]

Kannegundla

[11] Patent Number: 4,866,299

[45] Date of Patent: Sep. 12, 1989

[54] REMOTELY DRIVING A CCD

[75] Inventor: Ram Kannegundla, Rochester, N.Y.

[73] Assignee: Eastman Kodak Company, Rochester, N.Y.

[21] Appl. No.: 227,046

[22] Filed: Aug. 1, 1988

[51] Int. Cl.⁴ .............................................. H03K 5/01
[52] U.S. Cl. ................................... 307/270; 307/269; 377/60
[58] Field of Search .............. 307/262, 263, 269, 270; 377/60, 63, 62; 358/904, 909, 213.23, 213.31

[56] References Cited

U.S. PATENT DOCUMENTS

| | | | |
|---|---|---|---|
| 3,168,656 | 2/1965 | Kobbe | 307/263 |
| 4,419,593 | 12/1983 | Butler et al. | 307/268 |
| 4,424,456 | 1/1984 | Shiraki et al. | 307/268 |
| 4,498,021 | 2/1985 | Uya | 307/263 |

FOREIGN PATENT DOCUMENTS 0053955  4/1979  Japan ................................... 307/263

*Primary Examiner*—John Zazworsky
*Attorney, Agent, or Firm*—Raymond L. Owens

[57] ABSTRACT

A clock driver apparatus for remotely driving a CCD capacitive load includes a coaxial cable, a reactance load and a driver circuit having a resistor and diode connected in parallel at the output of the circuit to provide short circuit protection for the switching transistors of the driver circuit.

3 Claims, 2 Drawing Sheets

REMOTELY DRIVING A CCD

CROSS REFERENCE TO RELATED APPLICATION

Reference is made to commonly assigned U.S. patent application Ser. No. 067,749 filed June 29, 1987, Pat. No. 4,761,565, entitled "CCD Clock Driver Circuit" to Kannegundla.

FIELD OF THE INVENTION

The present invention relates to clock driver apparatus for remotely driving charge coupled devices.

BACKGROUND OF THE INVENTION

Charge coupled devices (CCD's) are used in various fields such as solid state imaging, analog signal processing, analog delay lines and memories for analog and digital signals. In the process of transferring signals either to or from the cells of the CCD, the CCD presents a capacitive load to clock drivers. Transferring signals in the form of charge packets from one location to the next of a CCD or from a CCD to an external processing circuit is called charge transfer. The efficiency with which a charge packet is transferred is referred to in the art as "charge transfer efficiency." In order to have effective use of such CCD's, the charge transfer efficiency should be as high as possible.

The signal, in the form of a charge packet, is transferred from one location to another by the application of an input pulse through a clock driver circuit. The function of the clock driver circuit is to provide a signal to the CCD at various required voltage levels with proper rise and fall times. Each cell has a certain capacitance. The total capacitive load presented to a clock driver circuit is linearly proportional to the number of cells. CCD's are often used for video applications. Typically charge packets are clocked out line by line for every 63.5 µs (line rate) and clocked out pixel by pixel at the pixel rate which depends upon the number of pixels in each line. The clock driver circuits used for CCD's are generally divided into two types, namely a vertical clock driver circuit and a horizontal clock driver circuit. Each of these circuits normally has two phases. Each phase drives a different channel that is 180° apart from the other channel. That is the first channel is at a high level while the second channel is at a low level and vice versa. The vertical clock drivers see many more cells and hence a relatively high capacitive load during transfer. The rate of transfer is at a low frequency. The horizontal clock drivers see a much lower capacitance (fewer cells) in the order of 50 to 100 pF.

Coaxial cable also has a complex transfer function due to its distributed nature. With the horizontal clock driving a long cable at a rate often of 100 MHz or higher. The load seen by the clock driver (including the cable) can be in the order of several thousand pF. Such a capacitive load requires 10 or more amperes of current with a 2 amp/ns rise and fall time. In addition, the fast rise and fall times are particularly necessary for high speed clock operation of CCD's used in electronic imaging.

Up to this invention it has not been possible to effectively drive high-speed CCD's at the end of long cables. Coaxial cables are essentially distributed inductors, resistors and capacitors. The resistance of a wire is independent of frequency. The inductive reactance of a cable is proportional to the frequency while the capacitive reactance of the cable is inversally proportional to the frequency. As the frequency of the signal passing through the cable increases to 10 mega Hertzs or more, the reactance of the cable poses a significant problem to the clock driver to drive capacitive loads at the end of the long cable. The CCD's transfer the charge at the application of square wave signals. It is well known that the Fourier Transform of a square wave signal is the sum of fundamental frequency and odd harmonics. To send square wave signals through cables, the clock driver is subjected to a load which is a function of frequency. This then transfer function of the system is complex. Hence, to run a CCD at the end of a long coaxial cable, the clock driver faces two essential problems:

(a) the coaxial cable itself becomes a load which is proportional to the length of the cable for higher frequencies in the order of 10 or more mega Hertzs; and (b) the characteristic impedance of coaxial cable varies with frequency while the square wave signals are composed of multiple frequencies.

Normally, CCD's are placed as close as possible to driver circuits and signal processing circuits to avoid above-mentioned problems. It has not been possible to remotely drive CCD's at high speed. In order to remotely drive a CCD through a cable, the clock driver would need to deliver higher switching current in the order of 1 to 10 Amperes in 5 nanoseconds depending on the length of the cable. In addition, it requires to make the characteristic impedance of the cable close to unity for at least first three harmonics of the frequency under consideration.

SUMMARY OF THE INVENTION

It is an object of the present invention to provide a clock driver apparatus which can be used to remotely drive both high and low capacitive loads at high speeds.

The above objects are achieved in a clock driver apparatus for remotely driving a CCD capacitive load which in response to an input clock signal provides driving current into such load at a frequency of interest, comprising:

(a) a coaxial cable;

(b) a reactive network connecting said CCD to said cable, said reactive network being selected to match the impedance of said cable at the frequency of interest;

(c) a plurality of driver circuits connected in parallel, each having an input and output and two switching transistors connected in series which alternately changes state in response to the level of said clock signal;

(d) a separate, resistor, and a diode connected in parallel to the output of each driver circuit to provide short circuit protection for at least one of the switching transistors of each driver circuit; and (e) the output of each driver circuit being connected to said cable to provide charging current to said CCD capacitive load.

By paralleling the short circuit protected high frequency switching transistors, very high switching currents are obtained. The addition of a passive reactive network in series with the load (CCD) at the end of the cable changes the characteristic impedance of the cable and can be made equal to unity for the first three harmonics of signal under consideration. The type of passive network and the values of the components in the passive network are determined by the length of the cable, frequency of the signal under consideration and the value of the load.

Circuits in accordance with the present invention have been made to operate CCD's at low loads, such as 100 Pf, at the end of 25 feet of cable for frequencies up to 12 MHz. Advantages of operating a CCD imager (camera) at the end of a long cable is that the size of the camera (CCD and lens) can be made quite small, about the size of a thumb.

IN THE DRAWINGS

FIG. 1 is a schematic of a clock driver apparatus for remotely charging a capacitor C which represents a CCD; and FIG. 2 is a schematic showing another driver circuit.

DETAILED DESCRIPTION OF THE PREFERRED EMBODIMENT

A schematic diagram of clock driver apparatus 10 is shown. Apparatus 10 includes a CCD device depicted as a single capacitor C, a coaxial cable 12, a reactive load 14 connecting the cable 12 to the CCD C, and two identical driver circuits 16.

Figure 1:
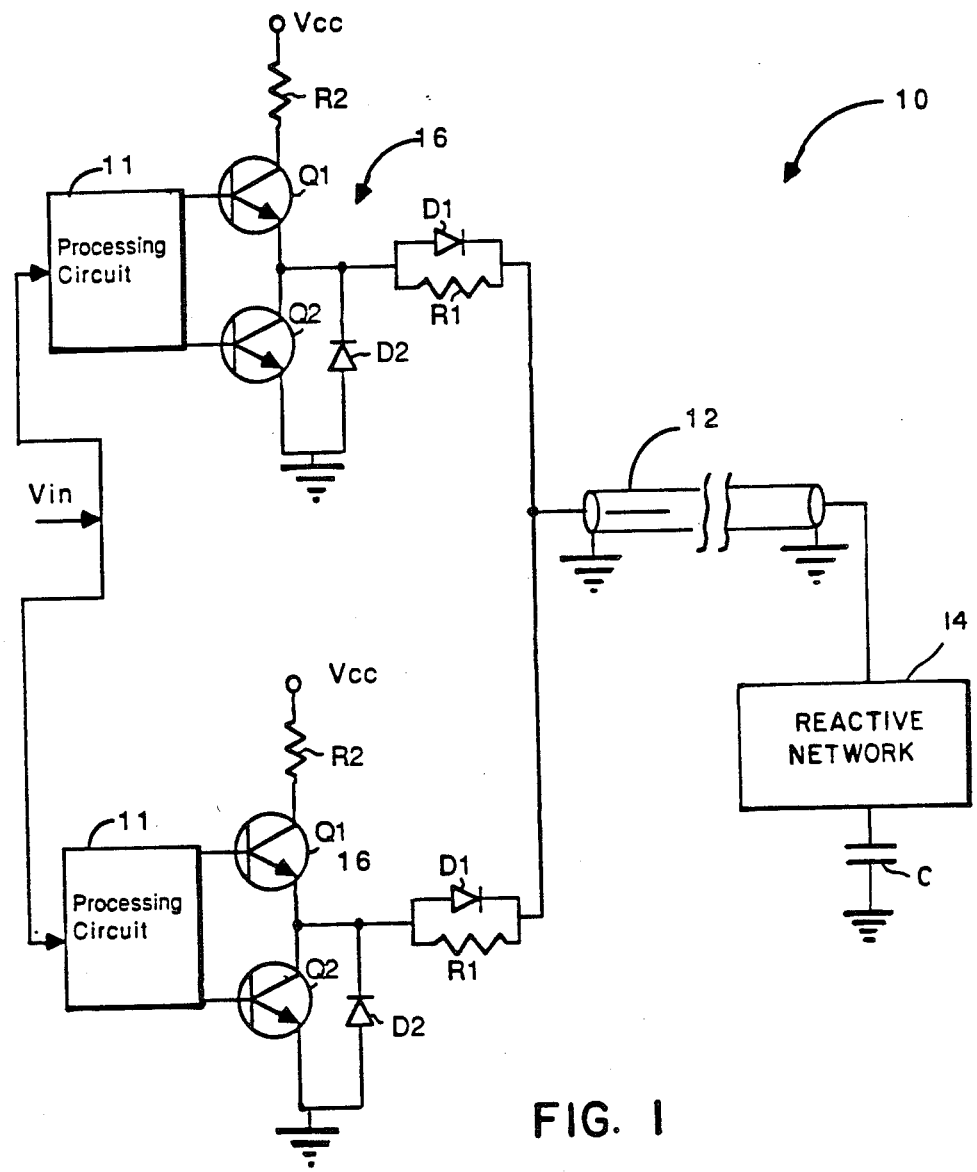
Figure 2:
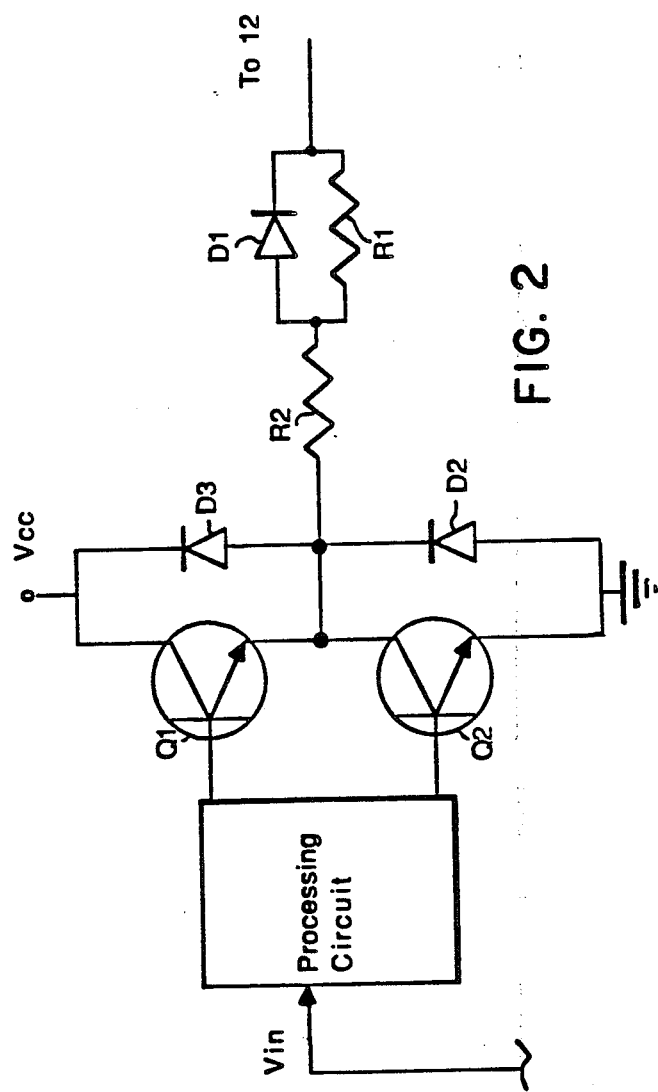

As shown in FIG. 1 each driver circuit includes switching transistors $Q_1$ and $Q_2$ which are the equivalent of switches. A protective diode D2 is connected in parallel with $Q_2$. An input voltage $V_{in}$ is applied to a processing circuit 11 which in turn gives out of phase voltage signals to the bases of transistors $Q_1$ and $Q_2$. In order to operate a CCD capacitor C, the transistor $Q_1$ is turned on by the processing circuit 11 when the transistor $Q_2$ is turned off. A circuit path is created from the potential $V_{cc}$, a resistor $R_2$, transistor $Q_1$ and a diode $D_1$ to the capacitor C. The resistor $R_2$ has been selected to provide protection for the transistor $Q_1$. In the event the resistor $R_2$ is not provided in the position of FIG. 1, then it could be provided directly adjacent to the parallel combination of diode $D_1$ and $R_1$ as shown in FIG. 2. In the case of FIG. 2 a driver circuit path is created from the potential $V_{cc}$, transistor $Q_1$, resistor $R_2$ and a diode $D_1$, through cable to the capacitor. In FIG. 2 an additional protection diode D3 is connected in parallel with $Q_1$. In FIG. 1, in order to discharge the capacitor C, the transistor $Q_1$ is turned off and the transistor $Q_2$ is turned on. A circuit path is now created from the capacitor C, load 14, cable 12 through resistor $R_1$ and transistor $Q_2$ to ground. Resistor $R_1$ provides protection for transistor $Q_2$. In FIG. 2 the resistor $R_2$ also provides protection for transistor $Q_2$. The circuits of both FIGS. 1 and 2 clock pulses having an equal as possible rise and fall time at the load.

In FIG. 1, the two driver circuits are connected in parallel. If more driving current for CCD (C) is needed, more driver circuits can be added in parallel. The driver circuits are, in fact, inverters, and all of the circuits 10 are provided with appropriate protection, with the parallel combination of $D_1$ and $R_1$.

EXAMPLE

A twenty five (25) foot coaxial cable was connected to a 100 pF load and driven by a driver circuit at a series of different frequencies of interest. Different reactive networks were constructed to provide appropriate impedance matching. In the first four tests, inductors were constructed by winding a length of 24 gauge aluminum wire as indicated in the Table. Table I shows that for various frequencies a different reactive network is needed.

The invention has been described in detail with particular reference to preferred embodiments thereof, but it will be understood that variations and modifications can be effected within the spirit and scope of the invention.

TABLE I

| Test No. | Frequency of Interest | Reactive Network |
|---|---|---|
| 1 | 10 MHz | 11 inch wire wound |
| 2 | 11 MHz | 11 inch wire wound |
| 3 | 12 MHz | 5.5 inch wound wire |
| 4 | 13 MHz | 1 inch wound wire |
| 5 | 14 MHz | 22 ohms |
| 6 | 15 MHz | 47 ohms |

I claim:

1. A clock drive apparatus for remotely driving a CCD capacitive load at a frequency of interest which in response to an input clock signal provides driving current into such load, comprising:
   (a) a coaxial cable;
   (b) a reactive network connecting said CCD capacitive load to said cable, said reactive network being selected to match the impedance of said cable at the frequency of interest;
   (c) a plurality of driver circuits connected in parallel, each having an input and output and two switching transistors connected in series which alternately changes state in response to the level of said clock signal;
   (d) a separate, resistor, and a diode connected in parallel to the output of each driver circuit to provide short circuit protection for at least one of the switching transistors of each driver circuit; and
   (e) the output of each driver circuit being connected to said cable to provide driving current to said CCD capacitive load.

2. A clock driver apparatus for remotely driving a CCD capacitive load frequency of interest which in response to an input clock signal provides driving current into such load, comprising:
   (a) a coaxial cable;
   (b) a reactive network connecting said cable to said CCD capacitive load, said reactive network being selected to match the impedance of said cable at the frequency of interest;
   (c) a plurality of first driver circuits connected in parallel each having a common input and a common output and two switching transistors connected in series which alternately change state in response to the level of said clock signal, the inputs of said first driver circuit being connected in parallel and connected to receive said clock signal and the outputs of said first driver circuit being connected in parallel;

(d) parallel combination of a first resistor and a diode connected to the output each of said first driver circuits to provide short circuit protection for at least one of such first driver circuits switching transistor so as to provide as equal as possible clock/signal rise and fall times at the load; and (e) the outputs of each of said first driver circuits being connected to said cable provide driving current to said CCD capacitive load.

3. The clock driver circuit of claim 2 further including a second resistor connected in series with the first resistor.

* * * * *